(12) United States Patent
Froment et al.

(10) Patent No.: US 8,354,725 B2
(45) Date of Patent: Jan. 15, 2013

(54) MIM TRANSISTOR

(75) Inventors: Benoit Froment, Brussels (BE); Etienne Robilliart, Lumbin (FR)

(73) Assignee: STMicroelectronics Crolles 2 SAS, Crolles (FR)

( * ) Notice: Subject to any disclaimer, the term of this patent is extended or adjusted under 35 U.S.C. 154(b) by 40 days.

(21) Appl. No.: 12/984,465

(22) Filed: Jan. 4, 2011

(65) Prior Publication Data

US 2011/0095375 A1 Apr. 28, 2011

Related U.S. Application Data

(62) Division of application No. 11/904,305, filed on Sep. 25, 2007, now abandoned.

(30) Foreign Application Priority Data

Sep. 25, 2006 (FR) ...................................... 06 53920

(51) Int. Cl.
*H01L 21/70* (2006.01)
*H01L 27/118* (2006.01)

(52) U.S. Cl. ........ 257/368; 257/369; 257/202; 257/392; 257/E27.046; 257/E27.062

(58) Field of Classification Search .................... 257/43, 257/69, 204–216, 192, 279, 347, 410, E27.108, 257/E21.632, E21.633, 202, 218, 288, 296, 257/343, 348, 350, 368, 369, 392, 499, E27.046, 257/E27.06, E27.062; 349/49
See application file for complete search history.

(56) References Cited

U.S. PATENT DOCUMENTS

| 5,401,714 | A | 3/1995 | Chaudhari et al. |
| 5,869,387 | A | 2/1999 | Sato et al. |
| 5,900,665 | A * | 5/1999 | Tobita ............................ 257/357 |
| 6,121,642 | A * | 9/2000 | Newns ........................... 257/192 |
| 6,200,894 | B1 | 3/2001 | Licata et al. |
| 6,259,114 | B1 | 7/2001 | Misewich et al. |
| 6,274,916 | B1 * | 8/2001 | Donath et al. ................. 257/410 |
| 6,281,140 | B1 | 8/2001 | Chen et al. |
| 6,515,488 | B1 | 2/2003 | Thomas |
| 7,838,875 | B1 * | 11/2010 | Tsang ............................. 257/43 |
| 2002/0068419 | A1 | 6/2002 | Sakaguchi et al. |
| 2003/0155591 | A1 | 8/2003 | Kreupl |
| 2003/0184510 | A1 | 10/2003 | Chen |
| 2004/0108537 | A1 | 6/2004 | Tiwari |
| 2005/0139867 | A1 * | 6/2005 | Saito et al. ..................... 257/213 |
| 2005/0281119 | A1 * | 12/2005 | Shibata et al. ........... 365/230.06 |
| 2006/0128109 | A1 | 6/2006 | Phan et al. |
| 2006/0267024 | A1 | 11/2006 | Murphy et al. |

FOREIGN PATENT DOCUMENTS

DE 10023871 C1 9/2001
WO 2005/093868 A1 10/2005

* cited by examiner

*Primary Examiner* — Colleen Matthews
*Assistant Examiner* — Galina Yushina
(74) *Attorney, Agent, or Firm* — Seed IP Law Group PLLC

(57) ABSTRACT

The invention concerns a conducting layer having a thickness of between 1 and 5 atoms, an insulated gate being formed over a part of the conducting layer.

16 Claims, 3 Drawing Sheets

MIM TRANSISTOR

BACKGROUND OF THE INVENTION

1. Field of the Invention

The present invention relates to the field of miniaturized electronic components.

2. Description of the Related Art

In the field of voltage controlled integrated electronic components, currently MOS (Metal-Oxide-Semiconductor) type transistors are most commonly used, in which an isolated gate is positioned above a semiconductor portion in which a conducting or non-conducting channel can be formed depending on the biasing of the gate. A distinction is generally made between MOS transistors formed on a semiconductor wafer and MOS transistors formed on a thin semiconducting layer covered by an insulating layer mounted on a silicon wafer (SOI structure).

All of these MOS transistors present diverse problems when it is attempted to reduce their dimensions in order to achieve sizes in the order of several tens of nanometers. Among these problems, there are in particular the following:

- particular effects known as short channel effects are produced, these effects resulting in only partial control of the channel inversion caused by the field of the gate; this notably results in dependencies between the threshold voltage of the transistor, the length of the gate and the voltage applied between the source and drain of the transistor;
- it is difficult to obtain a gate oxide sufficiently thin and this leads to the use of gate insulating materials having very high dielectric constants which today cause integration problems;
- the cost of SOI type structures is currently very high;
- there are difficulties, in particular when a CMOS structure is used, in other words an N-channel MOS transistor positioned alongside a P-channel MOS transistor, to achieve good isolation between the transistors. Currently, the most common technique consists in using shallow isolation trenches (STI or Shallow Trench Isolation) or using insulating SOI wells, which lead to insulating surfaces between the transistors which have approximately the same surface area as the transistors, thereby resulting in a large area of lost space on the semiconductor chip;
- in general, there are numerous problems in differentiating between the ON and OFF states.

BRIEF SUMMARY OF THE INVENTION

One embodiment provides a new transistor structure allowing at least some of the problems associated with known MOS structures to be resolved.

According to a first embodiment of the present invention, there is provided a transistor comprising a conducting layer, for example a metal layer, having a thickness of between 1 and 5 atoms, an insulated gate being formed over a part of the conducting layer.

According to one embodiment of the present invention, electrodes are formed on both sides of the insulated gate.

According to a further embodiment of the present invention, the conducting layer is formed on an insulating layer, the insulating layer being formed on a semiconductor substrate.

According to a further embodiment of the present invention, the semiconductor substrate under the transistor is connected to a determined voltage.

According to a further embodiment of the present invention, the surface in contact with the underside of the transistor is treated to have a nanoroughness.

According to a second embodiment of the present invention, there is provided a complementary structure comprising two transistors as described above, formed adjacent to each other, in which the adjacent semiconductor substrate portions under each transistor are formed of opposite conductivity types, these portions being arranged to be biased so that the junction between them is non-conducting.

BRIEF DESCRIPTION OF THE SEVERAL VIEWS OF THE DRAWINGS

The foregoing and other features, aspects and advantages will become apparent from the following detailed description of embodiments, given by way of illustration and not limitation with reference to the accompanying drawings, in which.

DETAILED DESCRIPTION OF THE INVENTION

Embodiments disclosed herein are based on the phenomenon that, when a charge is positioned (or an electric field is applied) close to a metal lattice or to a conducting material, the surface layer of the metal lattice or conducting layer tends to become depleted. This phenomenon is limited to thicknesses in the order of one or two crystalline atomic layers of metal (0.1 to 0.3 nm).

Figure 1:
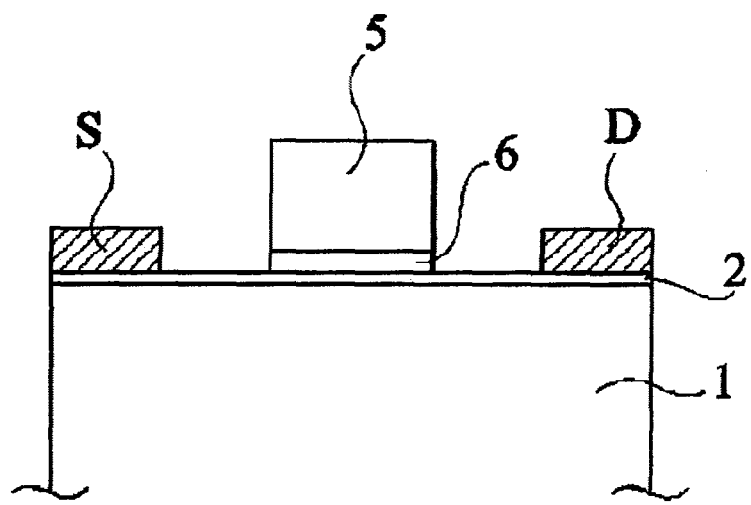
FIG. 1 is a schematic view of a Metal-Insulator-Metal (MIM) transistor according to an embodiment of the present invention.

FIG. 1 shows a transistor that utilizes this phenomenon. A very thin conductive layer (e.g., metal) 2 is deposited on an insulating substrate 1, the conductive layer having a thickness of one or a few atoms, for example a thickness in the order of 0.2 nm. A conducting gate 5 is formed on a part of this layer 2, separated from the layer 2 by an insulator 6. Contacts are made with the metal layer 2 on one side and the other side of the gate, in order to form source and drain contacts. With such a structure, depending on the biasing of the gate, the resistance between the source and drain zones will be increased or decreased due to the depletion imposed on the metal by the gate. Such a structure will be referred to as a MIM (Metal-Insulator-Metal) transistor.

Figure 2:
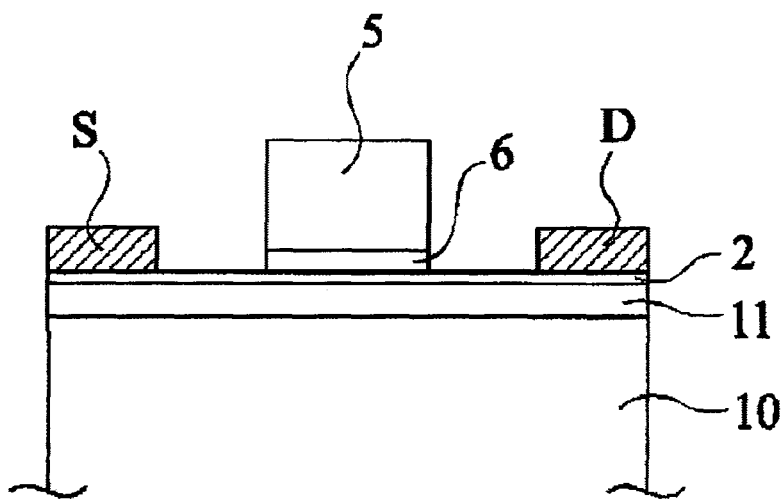
FIG. 2 is a schematic view of a further embodiment of a MIM transistor according to the present invention.

Preferably, as illustrated in FIG. 2, a structure is provided based on experience acquired in the field of standard MOS transistor fabrication technology. For example, a silicon wafer 10 covered by a thin layer of silicon oxide 11 is used as a substrate, the silicon oxide layer being covered by the very thin metal layer 2 on which the source and drain contacts S and D are formed on either side of the insulated gate 5.

The source voltage will be referred to as $V_S$, the drain voltage as $V_D$, the gate voltage as $V_G$, and the positive supply voltage as Vdd. With the structure of FIG. 2, simulations have shown that, for a gate voltage $V_G$=0, if the substrate 10 is connected to ground, a conducting state, or ON state, is obtained for a source voltage $V_S$=0 and a positive drain voltage $V_D$=Vdd. It follows that the resistance in the conducting state, $R_{ON}$, is equal to the resistance per square unit $R_{sq}$ of the metallic layer, multiplied by the ratio between the length and width of the gate L/W. In other words, $R_{ON}=R_{sq}(L/W)$. For a metal layer, for example of nickel, having a thickness of 0.2 nm and a resistivity $\rho=5$ microohms·cm and for a gate length L of 50 nm and a gate width W of 1 μm, $R_{ON}$ in the region of 10 ohms is obtained.

In the non-conducting state or OFF state, the corresponding voltages are for example $V_S=0$, $V_D=$Vdd, $V_G=$Vdd, and $R_{OFF}$ is then in the region of 1000 ohms or more.

According to another embodiment, a thin metal layer is deposited on an insulating layer having a certain roughness. There are various known methods for obtaining a silicon oxide surface having a roughness in the order of a few angstroms, or nanoroughness. For example the oxide surface could be bombarded with argon ions before the metal layer is deposited. It has been shown by simulations that this roughness of the silicon oxide surface appreciably increases the ratio $I_{ON}/I_{OFF}$ between the current in the ON state and current in the OFF state.

Transistors described above can be used to provide complementary type structures.

Figure 3:
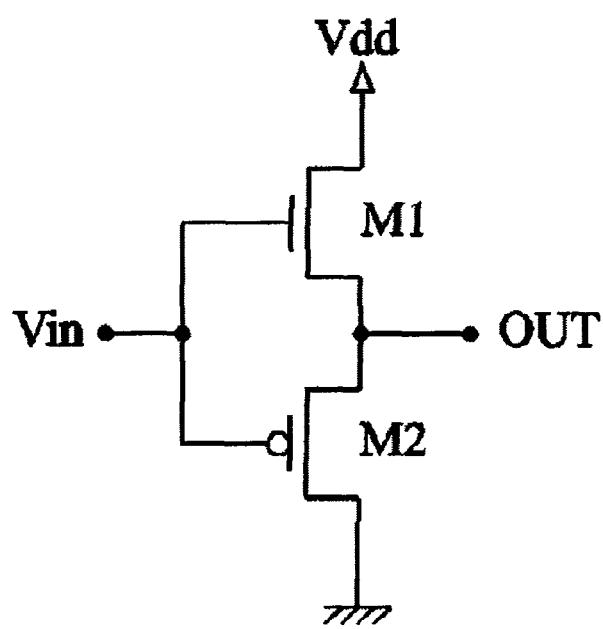
FIG. 3 shows the usual circuit diagram of a CMOS inverter.

FIG. 3 shows a circuit diagram of a complementary CMOS inverter comprising two complementary transistors M1 and M2 connected in series between a supply voltage Vdd and ground, their gates together receiving an input voltage $V_{in}$, and the common node between the transistors being connected to an output node OUT.

Figure 4:
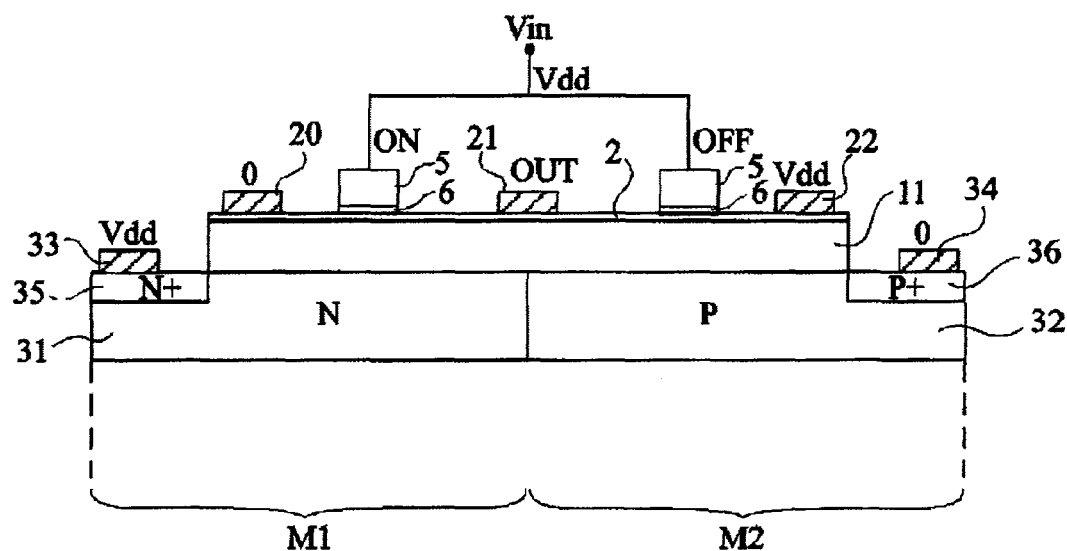
FIGS. 4 and 5 are cross-section schematic views of complementary MIM transistors according to embodiments of the present invention.

FIG. 4 is a schematic illustration of an example embodiment of such a structure, comprising MIM transistors as described above. According to this embodiment of the present invention, the substrates of two adjacent transistors are biased differently in order to provide the equivalent to a complementary CMOS transistor structure.

Each of the transistors M1 and M2 comprises, as described above, a very thin conductive layer 2 deposited on an insulating layer 11. Each of the transistors comprises a gate 5 isolated by an insulating layer 6. The transistor M1 comprises a source contact 20 and a drain contact 21. The drain contact 21 also forms the drain contact of transistor M2, transistor M2 also comprising a source contact 22 on the other side of the gate. In the example embodiment shown, transistor M1 is formed on an N-type doped silicon layer 31 and the transistor M2 is formed on a P-type doped silicon layer 32. These layers are formed using known technology relating to integrated circuit implementation on silicon. A contact 33 is formed on the N type silicon layer 31, over an intermediate more highly doped N-type layer 35. In the same way, a contact 34 is formed on the P-type doped silicon layer 32, over an intermediate more highly doped P-type region 36. The gates of the two transistors are together connected to a voltage $V_{in}$, the node 21 providing the output OUT of the inverter.

In the state shown in FIG. 4, the N layer 31 is connected to Vdd, the P layer 32 is connected to a zero voltage, a zero voltage is applied to the node 20 and a voltage Vdd is applied to node 22. Therefore, when the input $V_{in}$ is connected to Vdd, transistor M2 is non-conducting (OFF) and transistor M1 is conducting (ON), resulting in a zero voltage being provided at the output node OUT.

Figure 5:
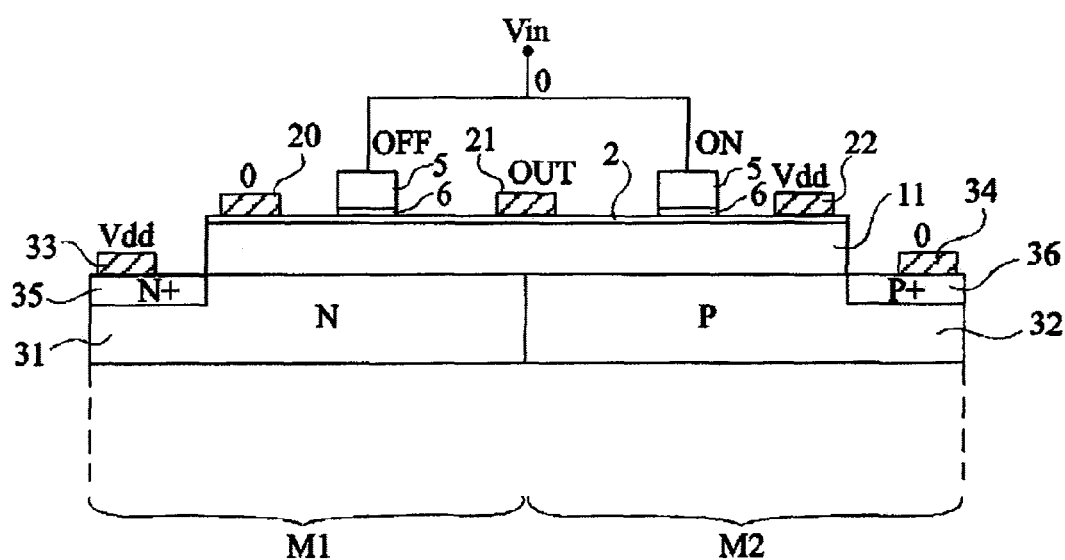

FIG. 5 shows the complementary state, in which the same voltages are applied to the substrate, but the voltage $V_{in}$ is inversed and is now equal to 0. Transistor M2 is now therefore conducting (ON) and transistor M1 is non-conducting (OFF), and the output voltage at node OUT is equal to Vdd.

It will be apparent to those skilled in the art that the embodiment illustrated in FIGS. 4 and 5 is extremely schematic and can be subjected to numerous variations. This example has been given to present one of the advantages of the disclosed embodiments, that two complementary MIM transistors can be positioned adjacent to each other without it being necessary to provide an insulating structure between them. Isolation between the adjacent substrates is ensured, an N-type region being polarized by a first voltage whilst a P-type region is polarized at a lower voltage.

A fundamental advantage of the MIM transistors described above is that an insulating region is no longer necessary between adjacent transistors, which allows a considerable reduction in the integrated surface area.

A further advantage of the disclosed embodiments is that the short channel effect no longer exists due to the channel being very thin and there being practically total control by the gate of the whole length of the channel.

A further advantage of the disclosed embodiments is that the technology is very simple: numerous implantation levels are not necessary and, if necessary, a structure can be provided on the same semiconductor chip as a standard MOS or bipolar transistor structure.

A further advantage of the disclosed embodiments is that the switch speed of the transistor is very fast, being limited only by the relaxation speed of electrons in the metal.

A further advantage of the disclosed embodiments is that the resistance in the conducting state is very low, in other words the current in the conducting state can be high.

The present invention is susceptible to numerous variations and modifications which will appear to the man skilled in the art. In particular, those skilled in the art will select materials that are appropriate to the particular technologies used. Notably, for forming the very thin metal layer, a material such as W, Ni, Mo, Ta, Ti, Pt, having a thickness of 0.2 to 1 nm could for example be used. Metal alloys could also be used, such as Ni—W, Ni—Fe, for which depletion may be greater. Non-metal conducting materials could also be used, which, while having higher resistance, may provide greater depletion.

One embodiment has been presented in the form of a planar transistor. The present invention applies more generally to all structures and all types of transistors in which a depletion effect can be used.

Figure 6:
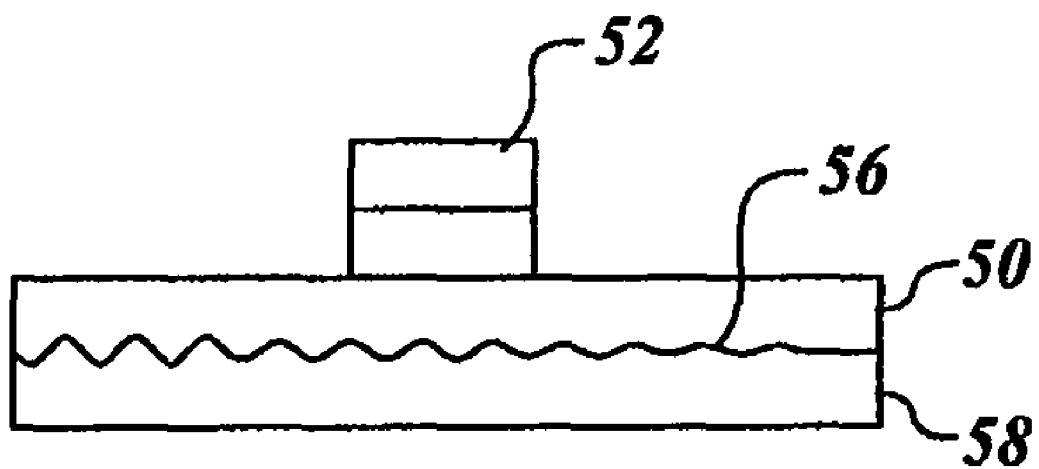
FIG. 6 is a schematic view of a portion of a transistor.

FIG. 6 shows a conducting layer 50 having a thickness of between 1 and 5 atoms and an insulated gate 52 being formed on at least a portion of the conducting layer 50. A surface 56 is in contact with the conducting layer 50 having a nanoroughness. An insulating layer 58 has the nano-roughened support surface 56.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A structure comprising:
   a first transistor including a first conductive portion of a continuous conductive layer having a thickness of between 1 and 5 atoms and a first insulated gate formed on at least a portion of the first conductive portion of the continuous conductive layer;
a second transistor including a second conductive portion of the continuous conductive layer having a thickness of between 1 and 5 atoms and a second insulated gate formed on at least a portion of the second conductive portion of the continuous conductive layer, the second transistor being adjacent to the first transistor; and
first and second semiconductor substrate portions under the first and second transistors, respectively, wherein the first and second semiconductor substrate portions have opposite conductivity types, are adjacent to one another, and are configured to be biased so that a junction between the semiconductor substrate portions is non-conducting.

2. The structure of claim 1, further comprising:
a first substrate contact positioned on the substrate and electrically coupled to the first semiconductor substrate portion;
a second substrate contact positioned on the substrate and electrically coupled to the second semiconductor substrate portion;
a first source contact positioned on the first portion of the conductive layer and electrically coupled to the first portion of the conductive layer and the second substrate contact; and
a second source contact positioned on the second portion of the conductive layer and electrically coupled to the second portion of the conductive layer and the first substrate contact.

3. The structure of claim 1, wherein the insulated gates are electrically coupled to each other.

4. The structure of claim 1, where a first material forming the first semiconductor substrate portion is N-type doped silicon and a second material forming the second semiconductor substrate portion is P-type doped silicon.

5. The structure of claim 4, wherein the first material physically contacts the second material.

6. The structure of claim 1, further comprising:
an insulator formed between the substrate and the continuous conductive layer.

7. The structure of claim 6, further comprising:
an output terminal positioned between the first and second insulated gates and contacting the continuous conductive layer.

8. The structure of claim 6, wherein the insulator is positioned between the continuous conductive layer and the first and second semiconductor substrate portions.

9. An inverter comprising:
a semiconductor substrate including first and second substrate portions having opposite conductivity types and positioned immediately adjacent to one another;
an insulating layer on the first and second substrate portions;
a continuous conducting layer having a thickness of between 1 and 5 atoms on the insulating layer;
a first insulated gate positioned on a first portion of the continuous conducting layer;
a second insulated gate positioned on a second portion of the continuous conducting layer;
a common drain contact positioned between the insulated gates and electrically connected to the conducting layer;
a first source contact positioned on the conducting layer and on an opposite side of the first insulated gate with respect to the common drain terminal; and
a second source contact positioned on the conducting layer and on an opposite side of the second insulated gate with respect to the common drain terminal.

10. The structure of claim 9, where a first material forming the first substrate portion is N-type doped silicon and a second material forming the second substrate portion is P-type doped silicon.

11. The structure of claim 9, further comprising:
a first substrate contact positioned on the substrate and electrically coupled to the first substrate portion and to the second source contact; and
a second substrate contact positioned on the substrate and electrically coupled to the second substrate portion and to the first source contact.

12. The structure of claim 9, wherein the insulated gates are electrically coupled to each other.

13. A structure comprising:
a semiconductor substrate including first and second substrate portions having opposite conductivity types and positioned immediately adjacent to one another;
a continuous conductive layer having a thickness of between 1 and 5 atoms;
a first insulated gate formed on a first portion of the conductive layer;
a second insulated gate formed on a second portion of the conductive layer;
a first substrate contact positioned on the substrate and electrically coupled to the first substrate portion;
a second substrate contact positioned on the substrate and electrically coupled to the second substrate portion;
a first source contact positioned on the first conductive layer and electrically coupled to the first conductive layer and the second substrate contact; and
a second source contact positioned on the second conductive layer and electrically coupled to the second conductive layer and the first substrate contact.

14. The structure of claim 13, where a first material forming the first substrate portion is N-type doped silicon and a second material forming the second substrate portion is P-type doped silicon.

15. The structure of claim 13, wherein the insulated gates are electrically coupled to each other.

16. The structure of claim 13, further comprising:
an output terminal positioned between the first and second insulated gates and contacting the first conductive layer and the second conductive layer.

* * * * *